United States Patent [19]

Rairden, III

[11] 3,998,603
[45] Dec. 21, 1976

[54] PROTECTIVE COATINGS FOR SUPERALLOYS

[75] Inventor: John R. Rairden, III, Niskayuna, N.Y.

[73] Assignee: General Electric Company, Schenectady, N.Y.

[22] Filed: Mar. 27, 1975

[21] Appl. No.: 562,431

Related U.S. Application Data

[63] Continuation-in-part of Ser. No. 392,547, Aug. 29, 1973, abandoned.

[52] U.S. Cl. ................................. 29/197; 427/250
[51] Int. Cl.$^2$ .................. C23C 13/02; B32B 15/20
[58] Field of Search ............ 427/250, 374 R, 328, 427/383 C; 29/194, 197

[56] References Cited

UNITED STATES PATENTS

| | | | |
|---|---|---|---|
| 3,050,417 | 8/1962 | Nack et al. | 427/318 X |
| 3,338,733 | 8/1967 | Rowady | 427/328 X |
| 3,594,219 | 7/1971 | Maxwell et al. | 29/197 X |
| 3,640,815 | 2/1972 | Schwartz et al. | 427/252 X |
| 3,652,235 | 3/1972 | Manilla et al. | 29/194 |
| 3,676,085 | 7/1972 | Evans | 427/250 |
| 3,846,159 | 11/1974 | Bornstein et al. | 29/194 |

*Primary Examiner*—James R. Hoffman
*Attorney, Agent, or Firm*—F. Wesley Turner; Joseph T. Cohen; Jerome C. Squillaro

[57] ABSTRACT

A protective coating is provided for nickel-base and cobalt-base superalloys which is highly resistant to corrosion in a fused $Na_2SO_4$ environment at elevated temperatures. The superalloy body is coated by physical vapor deposition with a thin layer of nickel-chromium alloy and then coated with a still thinner layer of aluminum and thereafter heat treated to strengthen the body and improve its rupture life while bonding the alloy coating to the body and diffusing the aluminum coating into the alloy coating and forming a chromium diffusion barrier in the nickel-chromium layer.

12 Claims, 3 Drawing Figures

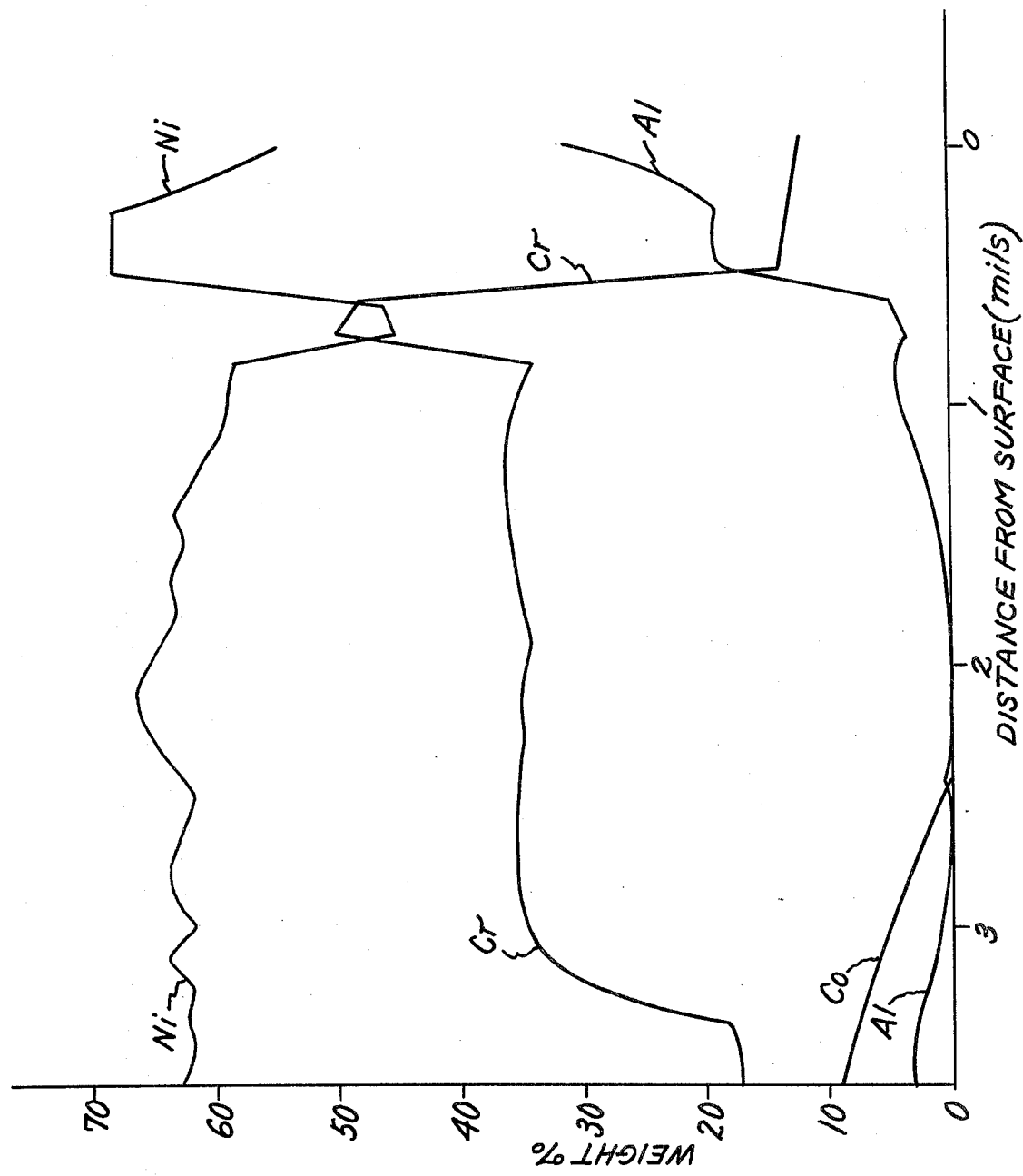

PROTECTIVE COATINGS FOR SUPERALLOYS

This invention was made under Contract with the United States Government under Contract 0-35510 with the United States Maritime Administration of the Department of Commerce. The U.S. Government is licensed in accordance with the terms of the aforesaid Contract and has reserved the rights set forth in Section 1(f) and 1(g) of the October 10, 1963 Presidential Statement of Government Patent Policy.

This is a continuation-in-part of patent application Ser. No. 392,547, filed Aug. 29, 1973, now abandoned.

The present invention relates generally to the art of corrosion protection and is more particularly concerned with an unique method of providing a corrosion-resistant coating on a superalloy substrate, and with the resulting novel article.

CROSS REFERENCE

This invention is related to that of my copending patent application Ser. No. 390,550, filed Aug. 22, 1973, entitled "Method of Coating Nickel-Base Superalloys" which discloses and claims the concept of applying an aluminum coating to a superalloy body by physical vapor deposition and in a single heat treatment operation strengthening the body and increasing its rupture life and diffusing the aluminum into the body surface portion and increasing its high temperature oxidation and corrosion resistance.

BACKGROUND OF THE INVENTION

The superalloys are heat-resistant materials having superior strengths at high temperatures. Many of these alloys contain iron, nickel or cobalt alone or in combination as the principal alloying elements together with chromium to impart surface stability and usually contain one or more minor constituents, such as molybdenum, tungsten, columbium, titanium and aluminum for the purpose of effecting strengthening. The physical properties of the superalloys make them particularly useful in the manufacture of gas turbine engine components.

Because alloy constituents which impart desirable strength properties generally reduce superalloy resistance to oxidation and corrosion at elevated temperatures, surface coatings or claddings are commonly provided. For this purpose, aluminum has been used alone as disclosed by Maxwell and Elam in U.S. Pat. No. 3,594,219 and in alloy form as disclosed by Simmons, Jr., in U.S. Pat. No. 3,649,225. In either case, the coating is normally applied after the article has been heat treated to develop the desired strength properties and the pack-cementation method is used for purposes of necessary close control to put down the aluminum and diffuse it into the surface region of the superalloy body. Thus, a heating step in addition to the heat-treating operation is necessary and, if rupture life is to be maximized, the article must be heated once again and quenched as by cooling in air. By first carrying out the pack coating operation the heat treating operation could be concluded with an air quench to avoid the necessity of a post heat treatment heating step. According to the prior art, however, there is no way in which the foregoing desired properties and results can be consistently obtained without carrying the superalloy article through at least two heating cycles and, in preferred practice, one of these is the time-consuming pack-cementation or coating operation.

SUMMARY OF THE INVENTION

This invention contemplates the protection of a superalloy body from oxidation and corrosion under high-temperature conditions of intended use by providing a nickel-chromium alloy coating bonded to the body and containing a small but critical amount of aluminum and including a chromium-rich or alpha phase diffusion barrier. Involved also is the new concept of combining in one heat treatment operation both the desired strengthening and oxidation-resistance development. This concept is predicated upon my discovery that the critical requirement as to the aluminum content in the nickel-chromium coating can be met consistently if at the outset of the strengthening heat treatment the nickel-chromium coating bears an overcoating of aluminum of thickness from one-tenth to three times that of the nickel-chromium coating, and if each coating is of uniform thickness within ± 0.1 mil and the aggregate thickness of the coatings is from one to seven mils. It is additionally based on my discovery that both coatings can readily be applied within the foregoing critical limits by physical vapor deposition under vacuum. Thus, I have further found that the amount of aluminum required for maximum oxidation resistance without embrittlement of the surface region of the ultimate article can be provided in this manner by matching aluminum coating thickness to the time and temperature of the strengthening heat treatment schedule dictated by the composition of the superalloy body. Thus, aluminum is not lost to a significant extent from the system during prolonged high temperature heat treatment, but diffuses into the superalloy body and causes the formation in the nickel-chromium coating of a high chromium (i.e., alpha phase) continuous diffusion barrier which serves to inhibit diffusion of coating constituents into the superalloy body and to inhibit diffusion of chromium and other constituents out of the body. In this manner, the desired properties of the body and its coating are preserved throughout the strengthening heat treatment.

Briefly described, in its method aspect this invention comprises the steps of coating a superalloy body by physical vapor deposition with a nickel-chromium composition containing 50-80% nickel and 20-50% chromium, then in similar manner establishing an overcoat of aluminum on the coated body, and then strengthening the body by heat treatment while diffusing the aluminum into the nickel-chromium layer and bonding the latter to the body and forming a chromium diffusion barrier.

In its article aspect, this invention takes the form of a coated superalloy article made by the method of this invention.

DESCRIPTION OF THE DRAWINGS

In the drawings accompanying and forming a part of this specification,

FIG. 3 is a chart like that of FIG. 1 of the surface region of the article of FIG. 2.

DETAILED DESCRIPTION OF THE INVENTION

Figure 1:
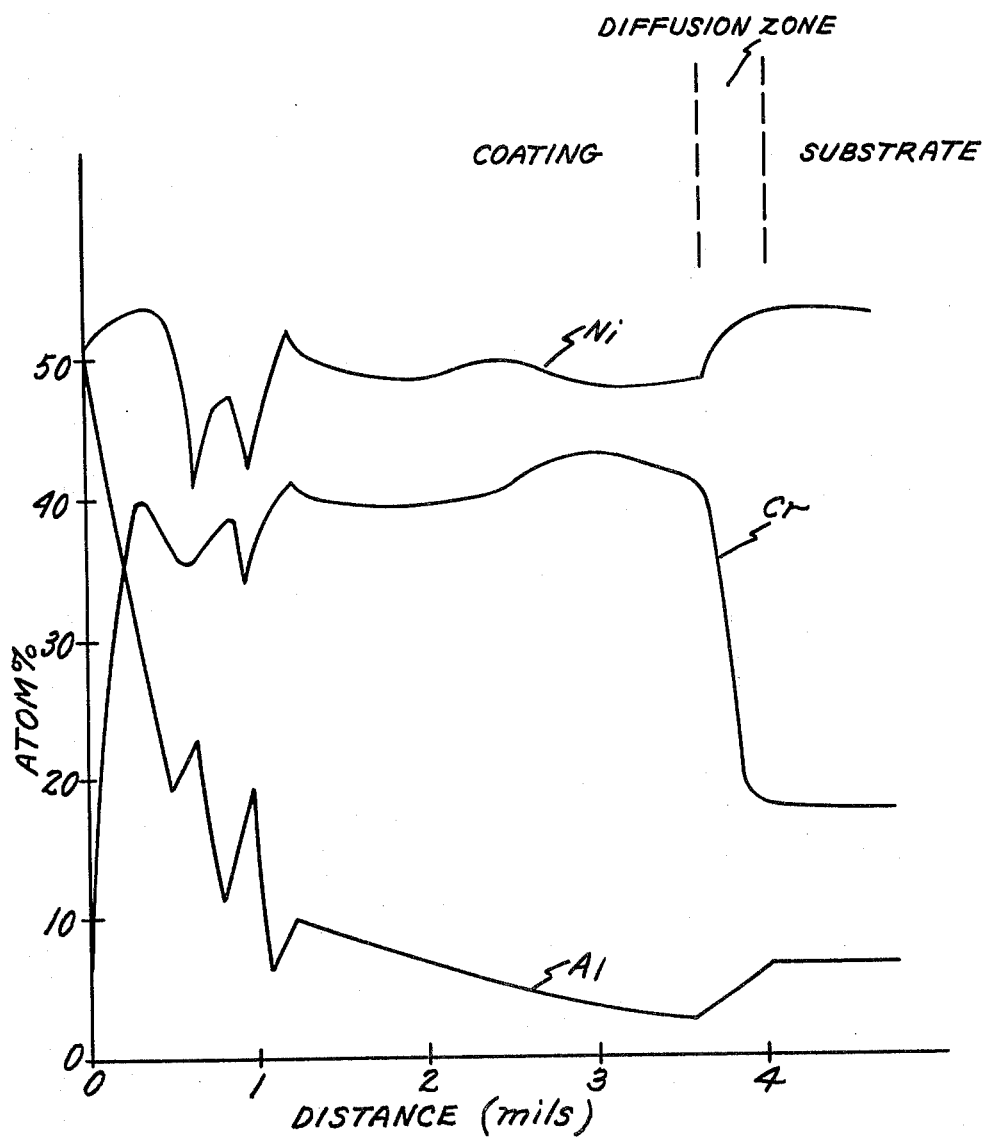
FIG. 1 is a chart bearing curves representing a microprobe profile of a superalloy body prepared in accordance with a preferred embodiment of the method of this invention.

In the preferred practice of the present invention process, an article such as a gas turbine bucket composed of a suitable superalloy composition as exemplified in the list set out below is provided with a coating of nickel-chromium alloy by physical vapor deposition.

| Element | René 80 | René 100 | IN-738 | Udimet 500 |
|---|---|---|---|---|
| C  | 0.17  | 0.18    | 0.17   | 0.08   |
| Mn | 0.2   | 0.50    | 0.20   | 0.75   |
| Si | 0.2   | 0.50    | 0.30   | 0.75   |
| Cr | 14.0  | 9.5     | 16.0   | 19.0   |
| Ni | Bal.  | Bal.    | Bal.   | Bal.   |
| Co | 9.5   | 15.0    | 8.5    | 18.0   |
| Mo | 4.0   | 3.0     | 1.75   | 4.0    |
| W  | 4.0   | —       | 2.6    | —      |
| Cb | —     | —       | 0.9    | —      |
| Ti | 5.0   | 4.20    | 3.4    | 2.9    |
| Al | 3.0   | 5.50    | 3.4    | 2.9    |
| B  | 0.015 | 0.015   | 0.01   | 0.005  |
| Zr | 0.03  | 0.06    | 0.10   | —      |
| Fe | 0.2   | 1.0 max.| 0.50   | 4.0    |
| Other | —  | 1.0 V   | 1.75 Ta| —      |

As a preliminary step, the bucket surface is cleaned suitably in a conventional manner to eliminate adhering foreign matter which would impair the bonding of the alloy coating to the superalloy body. Then the bucket is subjected to a vacuum of at least $10^{-4}$ torr and exposed to nickel-chromium alloy vapors generated by electron beam evaporation to provide a coating of alloy from 1 to 5 mils and of uniformity within approximately one-tenth mil. The bucket may be preheated, but preferably it is coated at room temperature as no particular advantage is to be gained by preheating, the desired substrate bonding effect being obtained in the subsequent strengthening heat treatment step.

On completion of the alloy coating step, the coated bucket is provided with an aluminum coating by a physical vapor deposition technique under a vacuum of at least $10^{-4}$ torr. This, like the nickel-chromium coating step, is preferably carried out as a continuous deposition process and the substrate body while being coated remains at room temperature. This coating is also uniform within $\pm 0.1$ mil and is at least 0.25 mil thick and may be up to 5.0 mils.

The coated and overcoated bucket is then ready for the strengthening heat treatment which, as those skilled in the art will understand, depends as to time and temperature upon the composition of the superalloy involved. Typically, for nickel-base alloys such as those set out below, the temperature will be in the range of 1040° C to 1230° C and the time will be from 0.25 to 5.0 hours. This is basically a solution heat treatment in which the gamma prime phase is dissolved to a large extent or preferably completely, but it may also include an aging treatment at a temperature below the solutioning temperature. In any event, the heat treatment is dictated by these requirements which, as those skilled in the art will recognize, vary somewhat with the different superalloy compositions.

As the heat treatment progresses, the nickel-chromium coating or layer becomes bonded to the superalloy bucket over the entire interface between these components. At the same time, aluminum rapidly diffuses into the nickel-chromium alloy coating as the aluminum is melted and alloys with the constituents of the nickel-chromium until an alloy is formed which has a melting point temperature approximating the heat treatment temperature, whereupon a chromium diffusion barrier of what is known as alpha phase is formed. This limit of the aluminum diffusion action is preferably located in the nickel-chromium alloy layer adjacent to the alloy bond between the alloy layer and the superalloy substrate. Under some circumstances, it may be desirable to have the aluminum diffuse into the alloy bond and even into the underlying superalloy substrate to a limited extent.

In the event that a cobalt-base superalloy is involved, the strengthening heat treatment schedule will involve solutioning the metal carbides as a primary purpose and this will be accomplished in such alloys at a temperature of approximately 1150° C. Again, as stated above, the thickness of the aluminum coating will be in the stated range.

The strengthening heat treatment is preferably carried out in an inert atmosphere but this invention opens the possibility of using air or other reactive atmospheres since the aluminum overcoating will protect against extensive oxidation of superalloy refractory metal constituents and resulting weakening of the structure.

At the conclusion of the strengthening heat treatment, whether it is conducted at a single temperature or at several different elevated temperatures in sequence, the workpiece or bucket is quenched by cooling in air, preferably to room temperature but suitably to an intermediate temperature, to substantially increase its rupture life. This improvement can be made in this manner in both cobalt-base and nickel-base superalloys. However, the slow cooling inherent in the pack-cementation process precludes the enhancement of the superalloy article rupture life.

Referring now to FIG. 1, the electron microprobe analysis reveals that this coating has pronounced compositional gradients of the elements Cr, Al and Ni. These compositional gradients are believed to be highly advantageous in providing a protective coating system as compared with the prior art wherein the NiCrAlY coating was substantially of a homogeneous composition. The advantages of the composition gradients obtained by this process can be understood in terms of the required chemical and physical properties of a useful coating.

First, the chemical requirements of the coating are that a thin, continuous, protective film of $Al_2O_3$ or $Cr_2O_3$ must be formed. Alternatively, a spinel-type oxide film such as $NiAl_2O_4$ or $NiCr_2O_4$ can also be highly protective. By providing for a high concentration of Al in the outer region of the coating, such as is done by the duplexing process, the formation of a highly protective $Al_2O_3$ film is promoted. Secondly, the mechanical property requirements of the coating are that it resist cracking and spalling. The high aluminum content of homogeneous NiCrAlY coatings leads to coating brittleness and a strong tendency to crack. Such cracks can propagate into the substrate material and lead to premature failure of the coated article. However, the graded composition coating provides for a lower aluminum (inner) region which is substantially tougher and more ductile than the high aluminum outer region and hence this tougher inner region should retard crack propagation from the coating to the substrate. Therefore, the graded composition concept described here is expected to enhance both the chemical and mechanical properties of the coating.

While, as indicated above, the nickel-chromium coating consists essentially of 50–80% by weight of nickel and 20–50% by weight of chromium, the preferred composition is 65% by weight of nickel and 35% by weight of chromium, which is designated as Ni-35Cr. This composition was found to perform best during high temperature oxidation and corrosion tests. When the amount of nickel exceeds 80% by weight, the oxidation resistance is unsatisfactory because there is insufficient Cr present to form a protective film of $Cr_2O_3$, whereas when the amount of nickel is below 50% by weight the coating becomes excessively brittle and fails by cracking and spalling from the substrate. Correspondingly, the amount of chromium should not exceed 50% by weight to prevent excessive brittleness, while less than 20% by weight leads to poor oxidation resistance. The nickel-chromium coating is applied to the substrate by a physical vapor deposition technique which is described in considerable detail in *Vapor Deposition*, Edited by C. F. Powell et al, John Wiley & Sons, New York (1966). Accordingly, the coating is evapoated and deposited in a vacuum chamber. Typically, the metal alloy is heated by an electron beam focused on the metal alloy ingot to evaporate the metal to a vapor. During evaporation, the vapor condenses as a coating on the workpiece. The material to be applied is heated in a high vacuum to a temperature at which its vapor pressure is about $10^{-2}$ torr or greater whereupon it emits molecular rays in all directions. During coating the vacuum must be very high to permit the molecular rays to travel from their source without disturbance until they hit the surface of the object to be coated. The aluminum overcoat is provided by evaporation from an electron beam heated source as described in my copending application Ser. No. 390,550, filed Aug. 22, 1973. This technique is particularly useful because the aluminum layer can be deposited in the same equipment used to deposit the nickel-chromium by simple substitution of an aluminum source.

Thereupon or after a storage period, but without additional processing, the coated body is treated to cause interdiffusion of the aluminum overlay into the first coating layer whereby the aluminum combines with the first coating to form a higher melting alloy. The minimum temperature for the heat treatment is about 950° C, while the maximum temperature depends upon the superalloy substrate, since it is undesirable to heat above the solutioning heat treatment of the alloy involved. For nickel-base superalloys, this tends to be in the range of about 1040°–1230° C. The heat treatment of cobalt-base alloys is much less complex than for nickel-base alloys and high temperature solution heat treatments are usually at about 1150° C. The time of heat treatment is preferably in the range of about 0.25 to 5.0 hours. Preferably, the heat treatment is performed in an inert atmosphere, e.g., helium, argon, so as to avoid oxidation of the aluminum surface.

My invention is further illustrated by the following examples:

EXAMPLE I

Using conventional techniques and equipment as described hereinabove, a coating 3.5 mils thick was deposited on a Udimet 500 nickel-base superalloy pin by vacuum evaporation from a source containing 65% by weight nickel and 35% by weight chromium and designated as Ni-35Cr. The electron beam heating technique was used to evaporate the source alloy. The coating was deposited on the rotating pin positioned four inches from the source in 20 minutes using a beam power of 4.3 kw.

The Ni-35Cr coating was found to be superior in hot corrosion resistance to coatings deposited from a Ni-20Cr source and a Ni-50Cr source. This indicates that the preferred composition is a nickel alloy containing greater than 20% Cr and less than 50% Cr.

A layer of pure aluminum 0.5 mil thick was deposited by electron beam evaporation over the Ni-35Cr. The deposition was for 10 minutes at a temperature of 540° C, and the deposition power was 5.1 kw. Segments cut from the coated pin were heat treated at temperatures of 900° C, 1050° C and 1200° C. The best heat-treatment temperature was 1200° C in order to insure the development of a good bond at the Ni-Cr/Al interface.

A sample of the Ni-Cr/Al-coated pin was heat treated in air for 30 minutes at 1200° C. This pin was then subjected to a 16-hour corrosion test at 900° C in a fused salt mixture of a composition containing 0.08mol $V_2O_5$; 0.9 mol $Na_2Co_3$; 0.01 mol $Na_2SO_4$; 0.01 mol NaCl. A segment of a pin similarly coated with only a Ni-35Cr layer was also corrosion-tested in the $V_2O_5$ bearing fused salt. The heat treated Ni-Cr/Al sample was essentially unattacked while the Ni-Cr sample was nearly completely corroded.

Another group of samples was subjected to a burner rig test which simulated conditions used in a marine gas turbine engine under highly corrosive conditions. The test was run to coating failure using a diesel fuel containing 1% by weight of sulfur and 467 ppm seal salt at a temperature of 1600° F with thermal cycling to room temperature three to five times per week. The hot corrosion was determined in mils per hour and the results are shown in the table below:

| | Hot Corrosion Rate (mils/hr.) | |
|---|---|---|
| | Substrate | |
| Coating | Udimet 500 | IN-738 |
| Uncoated | 25×10⁻³ | 33×10⁻³ |
| Ni-35Cr | 1.53×10⁻³ | 4.69×10⁻³ |
| Ni-35Cr + Al | 1.74×10⁻³ | 3.27×10⁻³ |

These results indicate that the Ni-35Cr coating greatly improves the hot corrosion resistance of nickel-base superalloy substrates. Furthermore, the effect of aluminizing to improve the hot-corrosion properties varies with the substrate and corrosive environment of the test.

EXAMPLE II

Following the procedure of Example I, a uniform thickness (3.0 mils, ± 0.1 mil) coating of Ni-Cr alloy (65% nickel and 35% chromium) was deposited on an IN-738 nickel-base superalloy pin. The pin temperature was 900° C during the 16-minute deposition period and beam power was maintained at 5.6 kw. Then an aluminum overcoating 0.5 mil thick in a similar uniformity was provided on the unheated substrate in 11 minutes with beam power at 5.8 kw.

Figure 2:
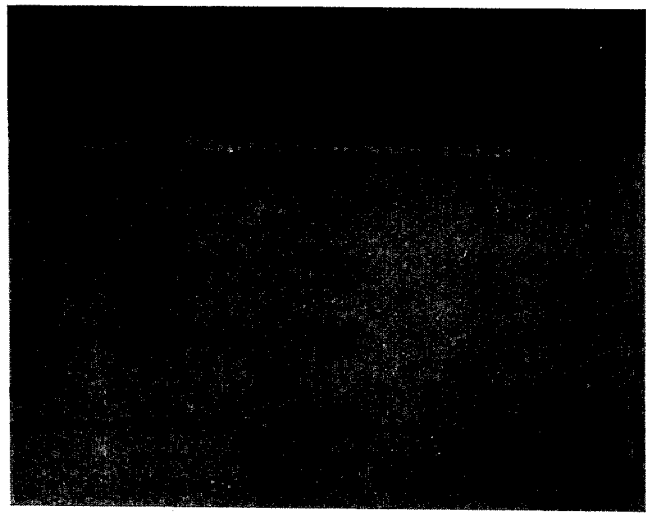
FIG. 2 is a photomicrograph of a portion of another superalloy body treated in accordance with this invention method showing the high chromium or alpha phase diffusion barrier in the nickel-chromium layer in the vicinity of the bond between the alloy layer and the substrate body.

The coated pin was then solution heat treated at 1160° C for 3 hours in argon and then rapidly cooled (quenched) in room temperature argon. FIG. 2 shows at a magnification of 750 diameters the resulting microstructure in the surface region of the superalloy body, the IN-738 substrate appearing as the lowermost band with the Ni-35Cr coating securely bonded thereto along the interface. The high chromium diffusion barrier (i.e., the alpha phase) appears as a relatively thin layer on the nickel-chromium alloy layer and a high aluminum layer covers the high chromium layer and constitutes the outermost part of the duplex-coated superalloy workpiece. This graphically illustrates the mechanism of the process of this invention which results as stated above in the formation of a high chromium diffusion barrier within the nickel-chromium alloy coating as the aluminum overcoat is metal and alloys with the nickel-chromium alloy coating, penetrating that coating until an alloy is formed which has a melting-point temperature at about the prevailing heat-treating temperature. Further penetration of the alloy layer by aluminum, whether in liquid form or solid state, is arrested, the latter by the diffusion barrier. Consequently, it will be seen that the location of the chromium diffusion barrier within the alloy coating will depend in every case not upon the time or temperature of the heat treatment but to a principal extent upon the amount of aluminum available to form the alloys leading to the ultimate establishment of the chromium diffusion barrier. In this case, the chromium diffusion barrier is relatively high in the alloy coating because of the very thin aluminum layer overcoating.

In the specification and the appended claims where reference is made to percentages, proportions or ratios, the weight basis is meant and intended unless otherwise expressly stated.

What I claim as new and desire to secure by Letters Patent of the United States is:

1. A method of improving the high temperature oxidation and corrosion resistance of a nickel-base or cobalt-base superalloy body which comprises the steps of:
   a. coating the superalloy body by physical vapor deposition with a first coating of a composition consisting essentially in weight percent of 50–80% nickel and 20–50% chromium of uniform thickness within ± 0.1 mil,
   b. then by physical vapor deposition providing on the resulting nickel-chromium a coating of aluminum of thickness in the ratio range to the nickel-chromium coating from one to ten to three to one and of uniform thickness within ± 0.1 mil, the aggregate thickness of the nickel-chromium coating and the aluminum coating being from one to seven mils; and
   c. then subjecting the resulting duplex coated superalloy body to heat treatment and thereby strengthening it while bonding the nickel-chromium coating to the body and diffusing aluminum into the nickel-chromium coating and forming a chromium diffusion barrier.

2. The method of claim 1, wherein the aluminum coating is of thickness from 0.25 to 5.0 mils and wherein the chromium diffusion barrier is in the nickel-chromium coating.

3. The method of claim 1, wherein the superalloy body is a nickel-base superalloy and the heat treatment involves heating in the temperature range of 1040°–1230° C for 0.25 to 5.0 hours in an inert atmosphere, and wherein the body is quenched by cooling in air to increase its rupture life.

4. The method of claim 1 in which the body is of cobalt-base superalloy and the heat treatment involves heating at a temperature of about 1150° C for 0.25 to 5.0 hours in an inert atmosphere, and in which the body is quenched by cooling in air to increase its rupture life.

5. A coated superalloy article produced by the method of claim 1.

6. A coated superalloy article produced by the method of claim 1, wherein the coated article comprises
   a. a nickel-base substrate consisting essentially of about the following nominal composition:

| Ingredient | Weight % |
|---|---|
| C | 0.17 |
| Mn | 0.20 |
| Si | 0.30 |
| Cr | 16.0 |
| Ni | Bal. |
| Co | 8.5 |
| Mo | 1.75 |
| W | 2.6 |
| Cb | 0.9 |
| Ti | 3.4 |
| Al | 3.4 |
| B | 0.01 |
| Zr | 0.10 |
| Fe | 0.50 |
| Ta | 1.75 | and
   b. a coating system thereon of a first coating composition consisting essentially of about 65 % by weight nickel and 35% by weight chromium, and an aluminum overlayer thermally diffused into the first coating to increase the oxidation and corrosion resistance of the substrate.

7. A method of improving the high temperature oxidation and corrosion resistance of a nickel-base or cobalt-base superalloy body which comprises the steps of:
   a. coating the superalloy body by physical vapor deposition with a first coating of a composition consisting essentially in weight percent of 50–80% nickel and 20–50% chromium of uniform thickness within ± 0.1 mil,
   b. then by physical vapor deposition providing on the resulting nickel-chromium a coating of aluminum of thickness in the ratio range to the nickel-chromium coating from one to ten to one to one and of uniform thickness within ± 0.1 mil, the aggregate thickness of the nickel-chromium coating and the aluminum coating being from one to seven mils; and
   c. then subjecting the resulting duplex coated superalloy body to heat treatment and thereby strengthening it while bonding the nickel-chromium coating to the body and diffusing aluminum into the nickel-chromium coating and forming a chromium diffusion barrier.

8. The method of claim 7, wherein the aluminum coating is of thickness from 0.25 to 5.0 mils and wherein the chromium diffusion barrier is in the nickel-chromium coating.

9. The method of claim 7, wherein the superalloy body is a nickel-base superalloy and the heat treatment involves heating in the temperature range of 1040°–1230° C. for 0.25 to 5.0 hours in an inert atmosphere, and wherein the body is quenched by cooling in air to increase its rupture life.

10. The method of claim 7, in which the body is of cobalt-base superalloy and the heat treatment involves heating at a temperature of about 1150° C. for 0.25 to 5.0 hours in an inert atmosphere, and in which the body is quenched by cooling in air to increase its rupture life.

11. A coated superalloy article produced by the method of claim 7.

12. A coated superalloy article produced by the method of claim 7, wherein the coated article comprises a. a nickel-base substrate consisting essentially of about the following nominal composition:

| Ingredient | Weight % |
|---|---|
| C | 0.17 |
| Mn | 0.20 |
| Si | 0.30 |

-continued

| Ingredient | Weight % |
|---|---|
| Cr | 16.0 |
| Ni | Bal. |
| Co | 8.5 |
| Mo | 1.75 |
| W | 2.6 |
| Cb | 0.9 |
| Ti | 3.4 |
| Al | 3.4 |
| B | 0.01 |
| Zr | 0.10 |
| Fe | 0.50 |
| Ta | 1.75 | and b. a coating system thereon of a first coating composition consisting essentially of about 65% by weight nickel and 35% by weight chromium, and an aluminum overlayer thermally diffused into the first coating to increase the oxidation and corrosion resistance of the substrate.

* * * * *